(12) United States Patent
Vanhoucke et al.

(10) Patent No.: US 8,319,546 B2
(45) Date of Patent: Nov. 27, 2012

(54) METHOD AND APPARATUS FOR MAINTAINING CIRCUIT STABILITY

(75) Inventors: Tony Vanhoucke, Bierbeek (BE); Godefridus A. M. Hurkx, Best (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/202,922

(22) PCT Filed: Jan. 21, 2010

(86) PCT No.: PCT/IB2010/050265
§ 371 (c)(1),
(2), (4) Date: Oct. 17, 2011

(87) PCT Pub. No.: WO2010/097715
PCT Pub. Date: Sep. 2, 2010

(65) Prior Publication Data
US 2012/0038415 A1 Feb. 16, 2012

(30) Foreign Application Priority Data

Feb. 25, 2009 (EP) ..................... 09100145

(51) Int. Cl.
G05F 1/10 (2006.01)
G05F 3/02 (2006.01)
H03K 17/04 (2006.01)
(52) U.S. Cl. .......................... 327/537; 327/375; 327/378
(58) Field of Classification Search .................. None
See application file for complete search history.

(56) References Cited

U.S. PATENT DOCUMENTS

| 3,526,846 | A | | 9/1970 | Campbell |
| 4,355,341 | A | | 10/1982 | Kaplan |
| 4,375,074 | A | * | 2/1983 | Glogolja ................ 361/91.1 |
| 4,669,026 | A | * | 5/1987 | Widlar ................ 361/103 |
| 4,893,158 | A | * | 1/1990 | Mihara et al. .............. 257/341 |
| 6,268,990 | B1 | * | 7/2001 | Ogura et al. ................ 361/91.7 |
| 6,417,732 | B1 | | 7/2002 | Radomski et al. |
| 6,587,002 | B1 | | 7/2003 | Vogt |
| 7,639,061 | B2 | * | 12/2009 | Sugiyama et al. ............ 327/374 |
| 7,873,335 | B2 | | 1/2011 | Hug et al. |
| 2008/0239597 | A1 | * | 10/2008 | Van Bezooijen et al. ....... 361/56 |

FOREIGN PATENT DOCUMENTS

| EP | 0 709 956 A1 | 5/1996 |
| EP | 1 794 880 | 6/2007 |
| EP | 1 820 269 A2 | 8/2007 |
| WO | 2004/004114 A2 | 1/2004 |

OTHER PUBLICATIONS

Sher, P. "Linear Power Control of GSM Amplifier Power, Microwaves & RF", retrieved from the internet at: http://mwrf.com/Articles/Print.cfm?Ad=1&ArticleID=5540, 3 pgs (Jul. 2003).

Vanhoucke, T. et al. "Unified Electro-thermal Stability Criterion for Bipolar Transistors", Proceedings of the Bipolar/Bicmos Circuits and Technology Meeting (BCTM), IEEE, 4 pgs. (Oct. 9, 2005).

International Search Report for Int'l Patent Appln. PCT/IB2010/050265 (Sep. 2, 2010).

* cited by examiner

*Primary Examiner* — Tuan T Lam

(57) ABSTRACT

A control circuit for a transistor arrangement comprises a monitoring arrangement (60) for monitoring the current flow and voltage across the transistor arrangement (50) and means (62) for determining if the current and voltage values define an operating point which falls within a stable operating region. The stable operating region comprises a region having a boundary (30) which comprises an electro-thermal instability line.

13 Claims, 4 Drawing Sheets

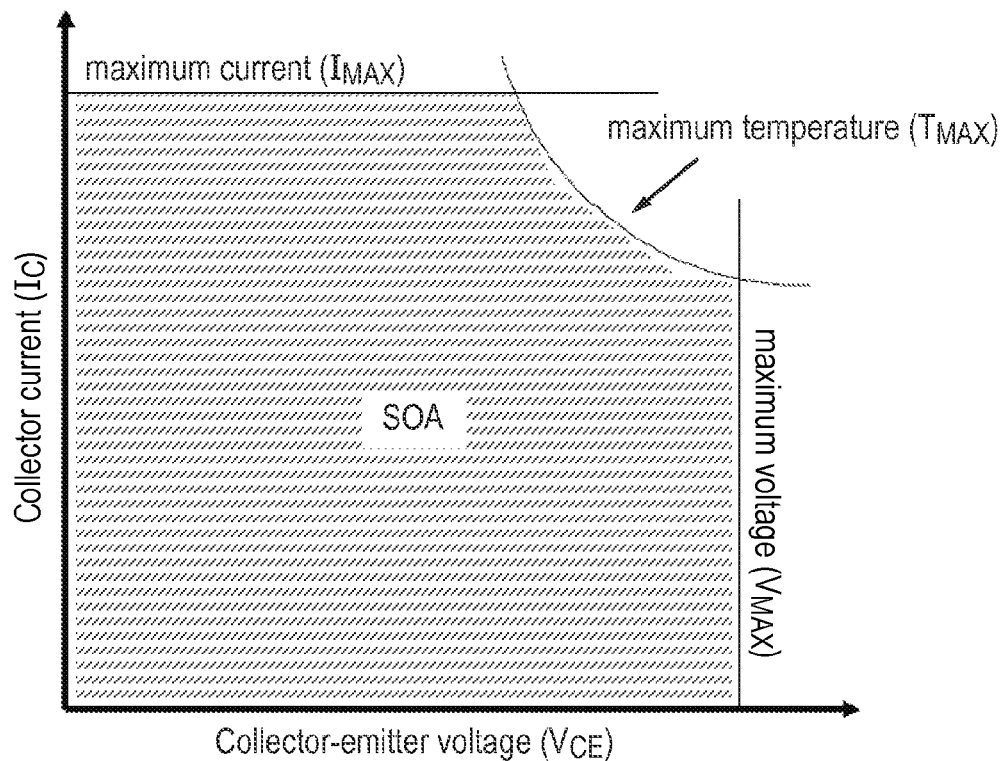
FIG. 1
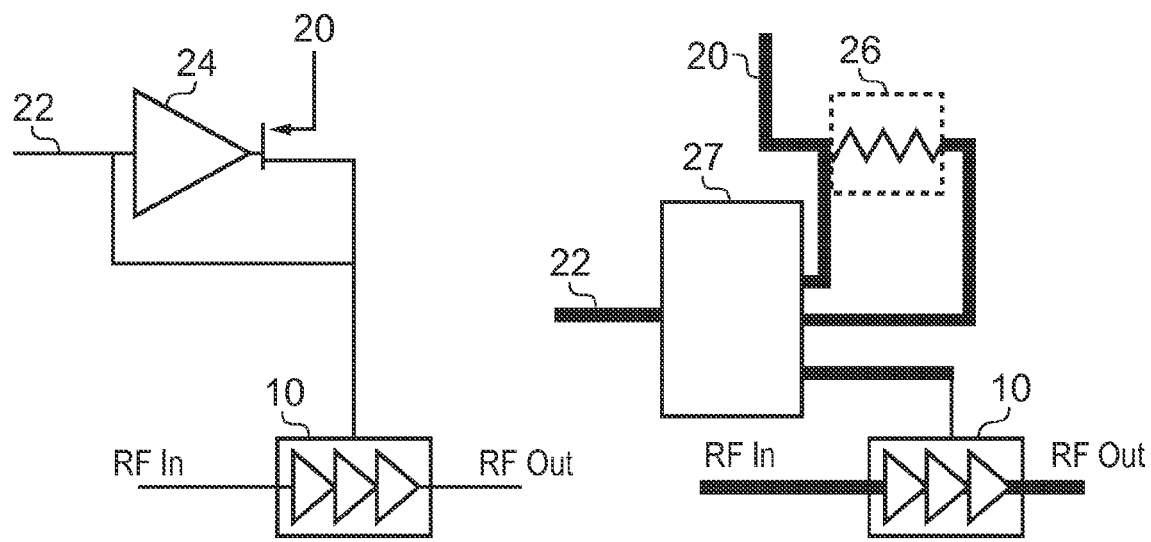
FIG. 2a
FIG. 2b

METHOD AND APPARATUS FOR MAINTAINING CIRCUIT STABILITY

This invention relates to a method and apparatus for maintaining circuit stability. The invention relates in particular to circuits including a power transistor or arrangement of power transistors.

It is well known that an important aspect of power amplifiers in, for example, portable applications (GSM, PDA, Bluetooth, ... ) is the ruggedness of the power transistor in the device. For example, the power transistor has to withstand a wide range of battery operations, large variations of temperature (e.g. car applications), and high mismatch variations for example resulting from different antenna impedance levels.

Many protection circuits have been proposed to protect the power transistor against these harmful situations. In bipolar technology, the three most important parameters to ensure the reliability of the transistor are maximum voltage ($V_{MAX}$), maximum current ($I_{MAX}$) and maximum operating temperature ($T_{MAX}$).

From these parameters, the maximum power dissipation can be calculated. This results in the well known SOA (Safe Operating Area) regions for a given transistor, as shown schematically in FIG. 1.

In a conventional circuit approach, the transistor will be protected to prevent operation outside its SOA region by detection circuits built around the power transistor. Many examples are available such as a combination of peak voltage and current detection, and temperature detection.

EP1794880 for example discloses a protection circuit for protecting the power transistor (e.g. a RF transistor in a RF power amplifier) against peak voltages above $V_{MAX}$. In EP1820269, a method is disclosed to detect peak currents through the power transistor. Different detection circuits can be combined in a single protection circuit.

A feedback loop is used to control (in particular reduce) the output power of the power transistor when one of the limits has been reached. This prevents damage to the power transistor.

FIG. 2 shows two known protection circuit principles. In FIG. 2a, a voltage protection circuit monitors the RF power amplifier 10. A ramp voltage 22 is applied to a differential amplifier 24. The output controls a transistor which determines whether or not the supply voltage 20 is supplied to the RF amplifier. In this way, a high-speed control loop is incorporated to regulate the collector voltage of the amplifier while the power amplifier stages are held at a constant bias. By regulating the power, the stages are held in saturation across all power levels.

In FIG. 2b, a current protection circuit monitors the RF amplifier 10, and uses a current sense resistor 26. The current-sensing method senses the current supplied to the power amplifier through the power supply. A CMOS controller 27 controls the base voltage of the field-effect transistor (FET) with an error voltage generated by applying the ramp voltage 22.

However, the maximum voltage, current and temperature lines in FIG. 1 do not represent the practical limits of operation of the transistor correctly and the protection circuits can still fail to protect the power transistor.

According to the invention, there is provided a control circuit for a transistor arrangement for implementing protection of the transistor arrangement, comprising:

a monitoring arrangement for monitoring the current flow and voltage across the transistor arrangement; and means for determining if the current and voltage values define an operating point which falls within a stable operating region, wherein the stable operating region comprises a region having a boundary which comprises an electro-thermal instability line.

The invention defines an improved boundary for controlling the safe operation of a transistor arrangement, which enables the transistor arrangement to be controlled such that instability problems are avoided.

The boundary is for example closer to the origin than a maximum temperature boundary line and a maximum power boundary line in the current-voltage plot for the transistor arrangement.

The monitoring arrangement can further be for monitoring the temperature.

The stable operating region boundary can for example be defined by a bipolar transistor collector current stability line $I_C^{crit}$ which satisfies:

$$I_C^{crit} = \frac{M_n V_T}{-M_n R_{eq} - R_{TH} V_{eq} \varphi}, \qquad [1]$$

$$R_{eq} = R_E + \frac{R_E + R_B}{M_n}\left(\frac{1}{\beta_0} - (M_n - 1)\right), \qquad [2]$$

$$V_{eq} = M_n V_{CB} + V_{BE}\left(1 + \frac{1}{\beta_0}\right), \qquad [3]$$

$M_n$=multiplication factor,
$V_T$=thermal voltage (=kT/q),
$\varphi$=the temperature dependence of the internal base-emitter voltage,
$R_E$=emitter resistance,
$R_B$=base resistance,
$R_{eq}$=equivalent resistance of $R_E$ and $R_B$,
$\beta_0$=current gain in absence of avalanche,
$V_{CB}$=base-collector voltage,
$V_{BE}$=base-emitter voltage,
$V_{eq}$=equivalent voltage of $V_{CB}$ and $V_{BE}$,
$R_{TH}$=thermal resistance [K/W],
wherein the stability line comprises the value of $I_C^{crit}$ for different values of base-collector and base-emitter voltages.

This defines a limit of stability for a bipolar transistor. In this case, the thermal voltage $V_T$ can be derived from a temperature measurement or a temperature estimate.

The circuit can further comprise a circuit for controlling the transistor arrangement to prevent the operating point moving outside the stable operating region. By way of example, the transistor arrangement can comprise an individual bipolar transistor or an emitter coupled pair of bipolar transistors.

The invention also provides a method of controlling a transistor arrangement for implementing protection of the transistor arrangement, comprising:

monitoring the current flow and voltage across the transistor arrangement;

determining if the current and voltage values define an operating point which falls within a stable operating region, wherein the stable operating region comprises a region having a boundary (30) which comprises an electro-thermal instability line; and controlling the transistor arrangement to prevent the operating point moving outside the stable operating region.

Examples of the invention will now be described in detail with reference to the accompanying drawings, in which:

FIG. 1 shows the traditionally known safe operating area of a bipolar transistor;

FIG. 2 shows known circuit examples for power control;

The invention is based on the idea of defining the SOA in such a way that it represents a region of transistor stability, with more accuracy than approaches based on current, voltage and/or temperature. Instead, an electro-thermal stability line is used to derive the boundary used to define the SOA.

In FIG. 1, it can be seen that the transistor will breakdown when crossing one of the traditional SOA boundaries ($I_{MAX}$, $V_{MAX}$ or $T_{MAX}$). Typically, $V_{MAX}$ is equal to the $BV_{CBO}$ (collector base breakdown voltage) while $I_{MAX}$ is determined by the electromigration limits, and both are well known process parameters.

Generally, power transistors are designed with large emitter areas to be able to draw enough current while operating at high voltages (i.e. high output power). When operating such transistors at high output power, a large part of the collector current is taken over by impact ionization or avalanche current, even for collector-emitter voltages below $BV_{CBO}$. Therefore, under such conditions, the traditional protection circuits based on the limits shown in FIG. 1 will not be triggered since $V_{CE}$ remains below $V_{MAX}$, but the stability of the transistor will be poor or even dramatic.

Similar to the maximum voltage, the maximum current and maximum temperature lines in FIG. 1 may not provide effective protection. The invention is based on the recognition of the use of a different stability line. In a first approximation, the transistor stability line can be defined as the current-voltage combination at which the emitter current density is not equally divided anymore over the (large) emitter area. In other words, at the stability line, the emitter current will be "pinched" towards the centre of the emitter area making an extremely high current density and "hot spot". Eventually, such high emitter current densities will destroy the transistor. This situation can occur for voltages or currents well below $V_{MAX}$ and $I_{MAX}$ respectively. Furthermore, at the stability line, the thermal resistance of the device can change which will modify the maximum temperature line towards lower values.

Figure 3:
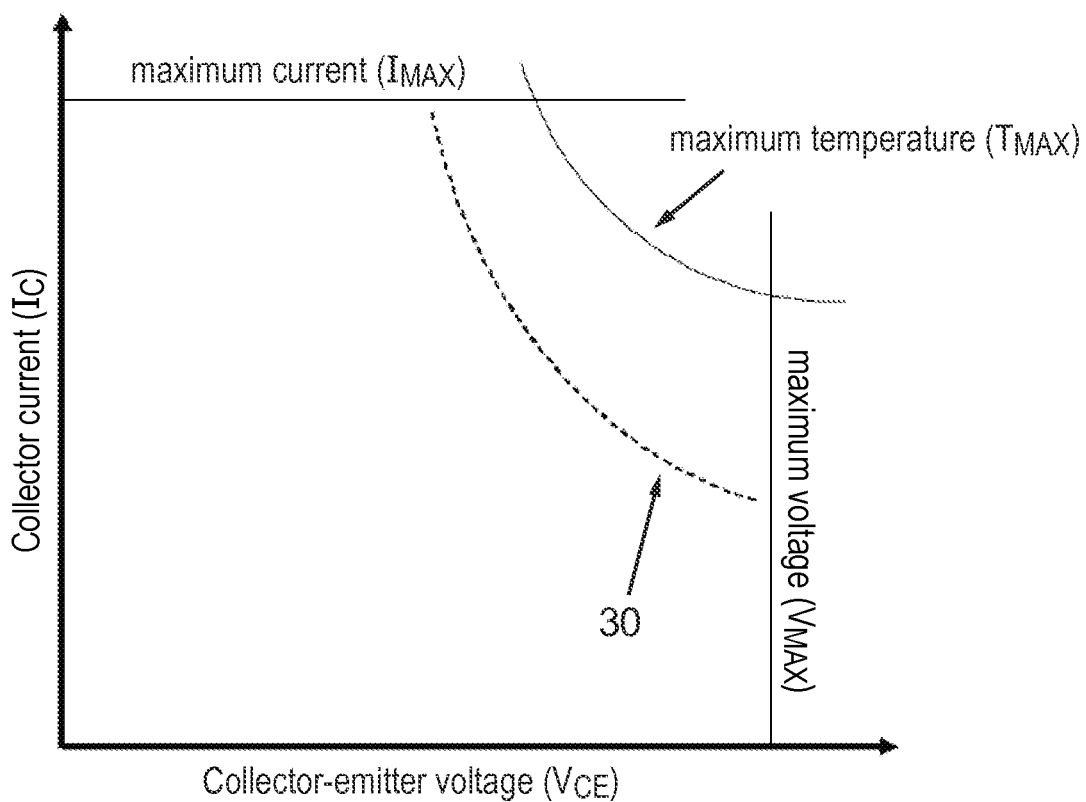
FIG. 3 shows the safe operating area of a bipolar transistor as defined by the invention.

FIG. 3 is a schematic representation of the safe-operating-area (SOA) of a typical bipolar transistor including an additional electro-thermal stability line 30 (described by Equation [1] below) which is used in the method and apparatus of the invention.

In accordance with the invention, the stable operating region is defined as a region having a boundary which comprises an electro-thermal stability line. This line is in practice closer to the origin than a maximum temperature boundary line and a maximum power boundary line in the current-voltage plot (as shown in FIG. 3).

In order to explain the invention, an example based on bipolar transistors will be used. It has been shown in the article "Unified Electro-Thermal Stability Criterion for Bipolar Transistors", T. Vanhoucke and G.A.M. Hurkx Procs. BCTM2005 that the stability of the transistor can be described mathematically by:

$$I_C^{crit} = \frac{M_n V_T}{-M_n R_{eq} - R_{TH} V_{eq} \varphi}, \quad [1]$$

$$R_{eq} = R_E + \frac{R_E + R_B}{M_n}\left(\frac{1}{\beta_0} - (M_n - 1)\right), \quad [2]$$

$$V_{eq} = M_n V_{CB} + V_{BE}\left(1 + \frac{1}{\beta_0}\right), \quad [3]$$

$I_C^{crit}$=the collector current at the stability line,
$M_n$=multiplication factor,
$V_T$=thermal voltage (=kT/q),
$\varphi$=the temperature dependence of the internal base-emitter voltage,
$R_E$=emitter resistance,
$R_B$=base resistance,
$R_{eq}$=equivalent resistance of $R_E$ and $R_B$,
$\beta_0$=current gain in absence of avalanche,
$V_{CB}$=base-collector voltage,
$V_{BE}$=base-emitter voltage,
$V_{eq}$=equivalent voltage of $V_{CB}$ and $V_{BE}$,
$R_{TH}$=thermal resistance [K/W].

Figure 4:
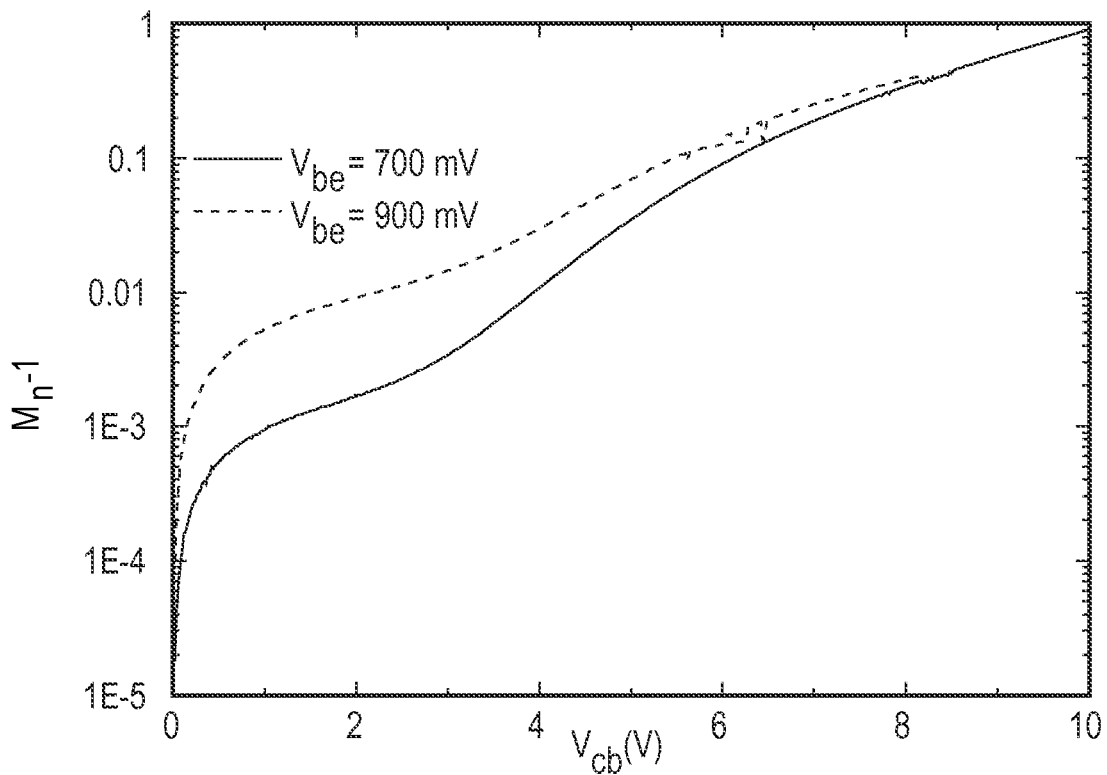
FIG. 4 is used to explain the impact ionization multiplication factor for a transistor.

The multiplication factor Mn is a parameter that quantifies the amount of impact ionization in the transistor. It is a function of $V_{CB}$ and $V_{BE}$. An example of Mn−1 versus $V_{CB}$ is shown in FIG. 4 (Mn is always greater than or equal to 1, so it is conventional to plot Mn−1).

In principle, the multiplication factor is known for every process. For example, high speed transistors (with low breakdown voltages) have higher Mn values than high voltage transistors (with low speed characteristics). So once the technology of the power amplifier transistor has been fixed, the Mn curve is known. Mn is also a function of the temperature and current. The limits of the Mn curve can be used to determine $I_C^{crit}$.

In order to calculate $I_C^{crit}$ $V_{CB}$ and $V_{BE}$ are required.

Figure 5:
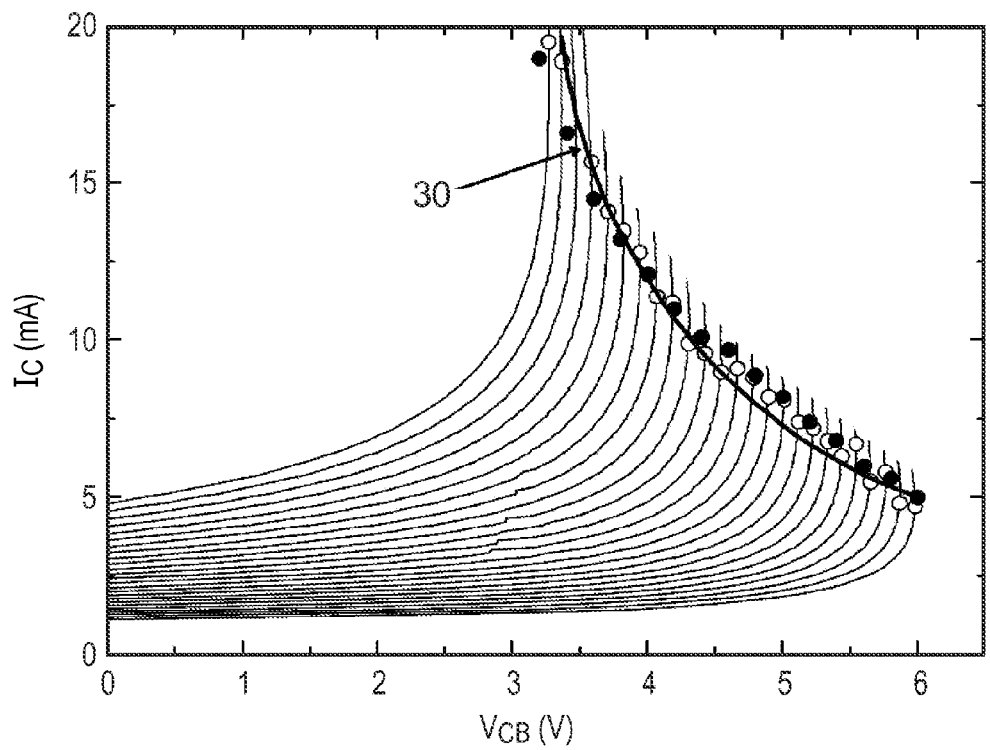
FIG. 5 is used to explain the safe operating area boundary in more detail.

FIG. 5 shows a plot for different values of base voltage and plots $V_{CB}$ versus the collector current.

In FIG. 5, every line corresponds to the collector current at fixed $V_{BE}$ while sweeping $V_{CB}$. As a result, every circle on the line 30 (where the slope becomes infinite) gives a value for $I_C^{crit}$ at that particular $V_{BE}$ and $V_{CB}$ with $V_{BE}+V_{CB}=V_{CE}$. Thus, FIG. 5 is constructed as $I_C$ versus $V_{CB}$ for different values of $V_{BE}$ (every line is one value for $V_{BE}$).

In FIG. 5, below the critical value of current $I_C^{crit}$, the transistor is stable while above the curve, instability will occur (as there is a negative slope in the curve). FIG. 5 is based on the measured stability line (the circular points) as well the theoretical prediction (the line plot 30).

In practice, for a given power transistor in an amplifier circuit, parameters $M_n$, $\varphi$ and $\beta_0$ are fixed by the transistor technology. The other parameters $R_E$, $R_B$ and $V_T$ (=kT/q) are known from the circuit and are operation dependent parameters.

Thus, when a designer makes a circuit using a particular power amplifier transistor, the parameters Mn, $\varphi$, RE, RB, β0 and $R_{TH}$ are known either from the transistor technology or from the circuit implementation. The only parameters that depend on the circuit operation are $V_T$ (dependent on temperature), $V_{CB}$ and $V_{BE}$. Therefore, the designer can make a look up table (LUT) using the equation for $I_C^{crit}$ and store this in a memory. An example of LUT could be:

| VBE (V) | VCB (V) | ICcrit (mA) | VCE = VCB + VBE (V) |
|---|---|---|---|
| T = 100 | | | |
| 0.6 | 6 | 5 | 6.6 |
| 0.65 | 5 | 5.3 | 5.65 |
| 0.7 | 4 | 6 | 4.7 |
| 0.75 | 3.5 | 7 | 4.25 |
| 0.8 | 3 | 8 | 3.8 |
| 0.85 | 2.8 | 9.5 | 3.65 |
| 0.9 | 2.6 | 12 | 3.5 |
| T = 125 | | | |
| 0.6 | 6 | 4.8 | 6.6 |
| 0.65 | 5 | 5.1 | 5.65 |
| 0.7 | 4 | 5.5 | 4.7 |
| 0.75 | 3.5 | 6.3 | 4.25 |
| 0.8 | 3 | 7 | 3.8 |
| 0.85 | 2.8 | 8 | 3.65 |
| 0.9 | 2.6 | 11 | 3.5 |
| T = ... | | | |
| ... | | | |

When operating the circuit $V_{BE}$, $V_{CB}$, $I_C$ and T are monitored. For example, if it is measured that T=100, the upper table above in the LUT is used. Next, a value of $V_{CE}$ (=$V_{BE}$+$V_{CB}$) is selected, for example 3.8 V. The measured $I_C$ is compared with the value of $I_C^{crit}$ in the LUT. According to the LUT above for $V_{CE}$=3.8 and T=100, $I_C^{crit}$=8 mA and if the measured $I_C$ is below 8 mA there is no problem. If the measured $I_C$ is above 8 mA, the operation has to be changed in order to prevent transistor damage.

An alternative approach would be to measure $V_{BE}$, $V_{CB}$, T and $I_C$ during operation in real time. Together with the known values for Mn, φ, $R_E$, $R_B$, β0 and RTH (stored in a memory), the value of $I_C^{crit}$ can be calculated in real time and compared with the measured $I_C$.

Figure 6:
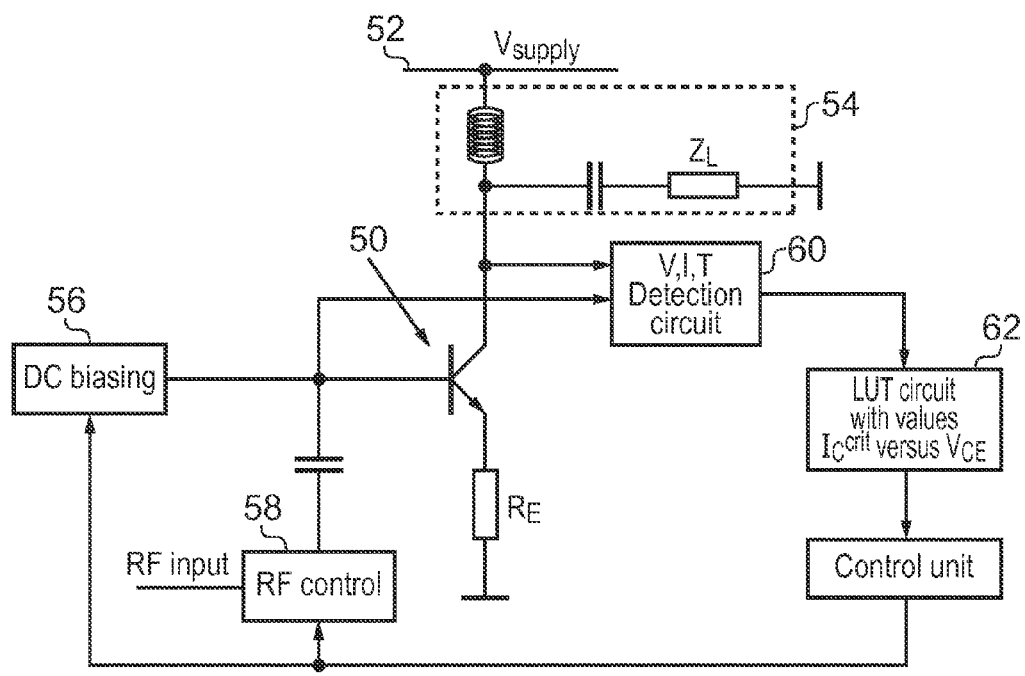
FIG. 6 is an example of circuit for implementing the method of the invention.

An example of an implementation of the invention is shown in FIG. 6.

The circuit comprises the power transistor 50, which is connected between a high power rail 52 and ground. The load is given by $Z_L$, and an inductor and capacitor are shown associated with the load. These are an RF choke and DC blocking capacitor. The use of a choke and DC capacitor is of course only one possible way of operating a power amplifier.

The transistor has a DC bias applied to its base by the DC biasing unit 56, and the output of an RF control unit 58 is coupled to the base.

The circuit has a monitoring arrangement 60 for determining the voltage, current and temperature of the prevailing transistor operating point. The monitoring arrangement 60 is connected to the base and the collector of the transistor to measure $V_{BE}$ and $V_{CB}$.

The DC biasing unit 56 together with the RF control unit 58 determine the effective value for $R_B$ in Equations [1]-[3], while all other parameters are derived from the particular circuit implementation and technology.

For a single transistor, $R_E$ and $R_B$ in the equation for $I_C^{crit}$ are the internal emitter and base resistances. However, when putting the transistor in a circuit and adding for example an external resistance $R_{external}$ at the emitter side, $I_C^{crit}$ should now be calculated with $R_E$=$R_{E\_internal}$+$R_{external}$, namely the sum of internal and external resistances.

A LUT (LookUp Table) circuit 62 is generated for the particular circuit with stored values of $I_C^{crit}$ as function of $V_{CE}$ and T from Equations [1]-[3]. During circuit operation, the V, I and T detection circuits provide the voltage, current and temperature values of the driver transistor to the LUT circuit 64. Comparing these values with the LUT values, the operation point of the transistor can be compared to the stability line. If the stability line will be crossed, the feedback loop to the RF control unit 58 and/or DC biasing unit 56 can then reduce the input signal to make the output power of the driver transistor lower to prevent instability and transistor/circuit damage.

Figure 7:
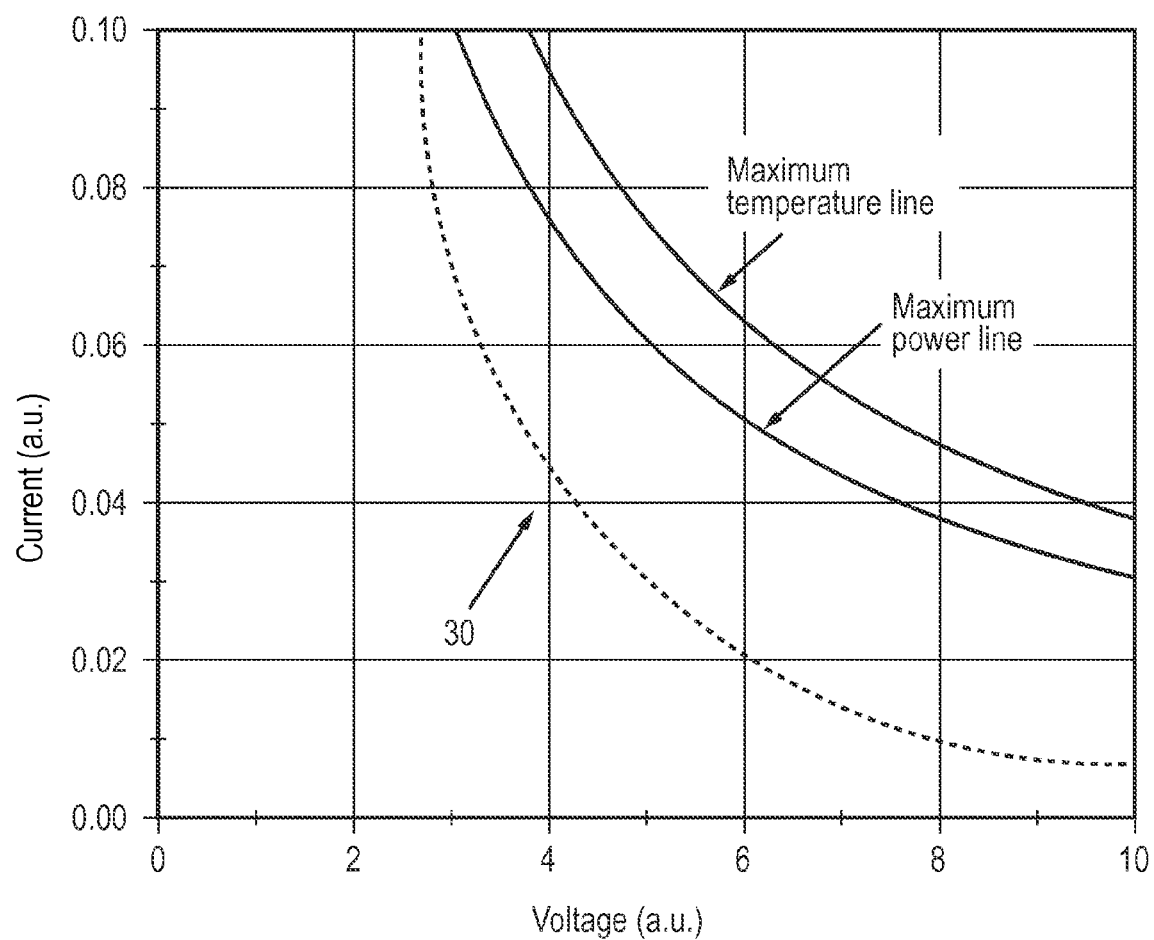
FIG. 7 shows an example of how the safe operating area boundary defined by the invention can be implemented and differs from known approaches.

It can be seen from the above description that the invention enhances V, I and T detection with a look up table circuit to give feedback to the power control, on the basis of a stability line. This can be considered to be an "electro-thermal stability-instability boundary", and it is different from a maximum temperature or maximum power of the device. This is shown schematically in FIG. 7, which shows the maximum power line, maximum temperature line and the approach based on an electro-thermal instability line 30.

From this schematic figure, it is clear that the electro-thermal instability line is different from the maximum temperature or power line. In fact, even combining both the maximum power and temperature line in one controller does not give enough information about the electro-thermal instability of the transistor.

The electro-thermal instability line is relatively easy to derive by monitoring $I_C$, $V_{CB}$ and $V_{BE}$. From the circuit, the (effective) base, emitter and collector resistances are also known, and the thermal resistance. Note that it is the "effective" resistance that is important which is different from the intrinsic transistor resistance. The same transistor can have a different effective resistance in two different circuits. Combining these values together with the measured values for $I_C$, $V_{CB}$ and $V_{BE}$ during operation, the electro-thermal instability line can be calculated and compared to the LUT as explained above.

By comparing the actual values during transistor operation with the maximum values in the LUT, the transistor can be protected. Measuring and controlling only power and/or temperature is not enough to protect the device against electro-thermal instability breakdown as enabled by this invention.

The feedback loop can be implemented in many ways. Thus, the feedback system using RF and DC control as in FIG. 5 is only an example but many other implementations are possible (e.g. clamping diodes).

In FIG. 6, after determining $V_{CE}$, $V_{CB}$ and T, the critical collector current $I_C^{crit}$ can be calculated and compared to the LUT values. If the calculated value is higher than the LUT values, something has to happen in order take the power amplifier transistor out of the instability region and to prevent it from damage. In FIG. 6 this has been done be reducing the input power by means of the DC biasing and/or the RF control unit. Since less input power or different DC biasing gives less output power, the transistor will go out of the instability region and is safe again.

However, rather than changing the DC biasing and/or the input power, the $V_{CB}$ voltage at the output can also be changed. Thus a $V_{CB}$ control unit could be provided at the collector side connected to the control unit of the LUT circuit.

In the example above, a theoretical electro-thermal instability line is used to determine the LUT values. The theoretical value can be scaled so that the SOA boundary is not defined exactly on the theoretical line, but a margin can be provided. However, the SOA boundary remains a function of the electro-thermal stability line.

In addition, instead of a theoretical modeling approach, a calibration approach can be used. For example for a particular device, $I_C$ and $V_{CE}$ (or $V_{CB}$) measurements can be taken (as shown in FIG. 5). The point at which the derivative becomes infinite is determined as a point lying on the electro-thermal stability line. The points are then stored in the LUT and used during operation of the device. The modeling approach is essentially a way of estimating these points without requiring full analysis of the device operation.

The calibration and modeling approaches can be combined. For example, an instability line determined by a calibration approach can be scaled for transistors with different dimensions.

The series of points in FIG. 5 at which the derivative becomes infinite is also known as the "flyback locus". Many papers have reported on the fact that these points represent a thermal hysteresis effect.

The eletro-thermal instability line used in the control system of the invention is essentially based on this flyback locus. It may be modeled by a different technique to that outlined above, for example taking into account different or additional parameters, such as collector resistance or mutual heating (which do not feature in equations [1] to [3] above).

The invention is not limited to RF power transistors.

For example, in an emitter coupled pair, both transistor are nominally "identical". However, in reality they are always slightly different for example due to processing variations (typically slightly different $R_B$). Therefore they will have a slightly different $I_C^{crit}$ for fixed $V_{CB}$ and $V_{BE}$. This $I_C^{crit}$ value can be calculated for both transistors when the circuit is made and stored in the LUT. When operating the coupled pair, $I_C$, $V_{CB}$ and $V_{BE}$ can be measured for both transistors and compared to the $I_C^{crit}$ values in the LUT to prevent instability.

When one of the transistors crosses the stability line, the total current will no longer equally divided over both transistors. This is the so-called current collapse. One transistor will take over the entire current and the emitter coupled pair will no longer work properly. With the implementation described above, the circuit can be protected "as a whole" to prevent such current collapse. In particular, the protection circuit will detect the moment at which one of the transistors reaches its critical current and can then react appropriately.

The feedback loop between the LUT control unit and the DC biasing unit has to be slow enough to prevent oscillation of the circuit. This relaxes the specifications for the LUT and control unit which do not have to be extremely fast. Therefore, the implementation can be simple and low cost.

In principle, measuring the transistor temperature is not essential.

Although the parameter $V_T$ in Equation [1] is needed to calculate $I_C^{crit}$, taking T equal to room temperature will underestimate $I_C^{crit}$ and therefore ensure the circuit to operate safely. Thus, the protection can be implemented without needing to take temperature measurements into account. Not including temperature measurements also makes the total protection circuit simpler.

Various modifications will be apparent to those skilled in the art.

The invention claimed is:

1. A control circuit for a transistor arrangement for implementing protection of the transistor arrangement, comprising:
    a monitoring arrangement for monitoring the current flow and voltage across the transistor arrangement; and
    means for determining when the current and voltage values define an operating point which falls within a stable operating region,
    wherein the stable operating region comprises a region having a boundary is defined by a bipolar transistor collector current stability line $I_C^{crit}$ which satisfies:

$$I_C^{crit} = \frac{M_n V_T}{-M_n R_{eq} - R_{TH} V_{eq} \varphi}, \quad [1]$$

$$R_{eq} = R_E + \frac{R_E + R_B}{M_n}\left(\frac{1}{\beta_0} - (M_n - 1)\right), \quad [2]$$

$$V_{eq} = M_n V_{CB} + V_{BE}\left(1 + \frac{1}{\beta_0}\right), \quad [3]$$

$M_n$=multiplication factor,
$V_T$=thermal voltage (=kT/g),
$\varphi$=the temperature dependence of the internal base-emitter voltage,
$R_E$=emitter resistance,
$R_B$=base resistance,
$R_{eq}$=equivalent resistance of $R_E$ and $R_B$,
$\beta_0$=current gain in absence of avalanche,
$V_{CB}$=base-collector voltage,
$V_{BE}$=Base-emitter voltage,
$V_{eq}$=equivalent voltage of $V_{CB}$ and $V_{BE}$,
$R_{TH}$=thermal resistance [K/W],
wherein the stability line comprises the value of $I_C^{crit}$ for different values of base-collector and base-emitter voltages and defines the boundary between electro-thermal stability and instability.

2. A circuit as claimed in claim 1, wherein the boundary is closer to the origin than a maximum temperature boundary line and a maximum power boundary line in the current-voltage plot for the transistor arrangement.

3. A control circuit as claimed in claim 1, wherein the monitoring arrangement is further for monitoring the temperature.

4. A control circuit as claimed in claim 1, wherein the thermal voltage $V_T$ is derived from a temperature measurement or a temperature estimate.

5. A control circuit as claimed in claim 1, further comprising a circuit for controlling the transistor arrangement to prevent the operating point moving outside the stable operating region.

6. A control circuit as claimed in claim 1, wherein the transistor arrangement comprises an individual bipolar transistor.

7. A control circuit as claimed in claim 1, wherein the transistor arrangement comprises an emitter coupled pair of bipolar transistors.

8. A method of controlling a transistor arrangement for implementing protection of the transistor arrangement, comprising:
    monitoring the current flow and voltage across the transistor arrangement;
    determining when the current and voltage values define an operating point which falls within a stable operating region, wherein the stable operating region comprises a region having a boundary; and
    controlling the transistor arrangement to prevent the operating point moving outside the stable operating region
    wherein the stable operating region boundary is defined by a bipolar transistor collector current stability line $I_C^{crit}$ which satisfies:

$$I_C^{crit} = \frac{M_n V_T}{-M_n R_{eq} - R_{TH} V_{eq} \varphi}, \quad [1]$$

-continued $$R_{eq} = R_E + \frac{R_E + R_B}{M_n}\left(\frac{1}{\beta_0} - (M_n - 1)\right), \quad [2]$$

$$V_{eq} = M_n V_{CB} + V_{BE}\left(1 + \frac{1}{\beta_0}\right), \quad [3]$$

$M_n$=multiplication factor,
$V_T$=thermal voltage (=kT/g),
$\phi$=the temperature dependence of the internal base-emitter voltage,
$R_E$=emitter resistance,
$R_B$=base resistance,
$R_{eq}$=equivalent resistance of $R_E$ and $R_B$,
$\beta_0$=current gain in absence of avalanche,
$V_{CB}$=base-collector voltage,
$V_{BE}$=Base-emitter voltage,
$V_{eq}$=equivalent voltage of $V_{CB}$ and $V_{BE}$,
$R_{TH}$=thermal resistance [K/W], wherein the stability line comprises the value of $I_C^{crit}$ for different values of base-collector and base-emitter voltages and defines the boundary between electro-thermal stability and instability.

9. A method as claimed in claim 8, wherein the stable operating region comprises a region having a boundary which is closer to the origin than a maximum temperature boundary line and a maximum power boundary line in the current-voltage plot for the transistor arrangement.

10. A method as claimed in claim 8, wherein the monitoring further comprises monitoring the temperature.

11. A method as claimed in claim 8 wherein the thermal voltage $V_T$ is derived from a temperature measurement or a temperature estimate.

12. A method as claimed in claim 8, wherein the transistor arrangement comprises an individual bipolar transistor.

13. A method as claimed in claim 8, wherein the transistor arrangement comprises an emitter coupled pair of bipolar transistors.

* * * * *